United States Patent [19]

Terada

[11] Patent Number: 5,295,049
[45] Date of Patent: Mar. 15, 1994

[54] INSTRUMENT FOR VEHICLE

[75] Inventor: Toshiyuki Terada, Tokyo, Japan

[73] Assignee: Stanley Electric Co., Ltd., Tokyo, Japan

[21] Appl. No.: 943,050

[22] Filed: Sep. 10, 1992

[30] Foreign Application Priority Data

Sep. 13, 1991 [JP] Japan .................................. 3-81935

[51] Int. Cl.$^5$ ............................................. G01D 11/28
[52] U.S. Cl. ....................................... 362/27; 362/28; 362/32; 116/288
[58] Field of Search ................. 362/23, 26, 27, 28, 362/29, 30, 32; 116/286, 288, 291, 305

[56] References Cited

U.S. PATENT DOCUMENTS

| | | | |
|---|---|---|---|
| 3,033,155 | 5/1962 | Beckman | 116/288 |
| 3,568,630 | 3/1971 | Blackwell | 362/29 |
| 4,180,847 | 12/1979 | Cresko et al. | 362/32 |
| 4,252,078 | 2/1981 | Fukasawa et al. | 116/288 |
| 4,878,453 | 11/1989 | Inoue et al. | 116/288 |
| 5,142,453 | 8/1992 | Ohta et al. | 362/29 |

*Primary Examiner*—Richard R. Cole
*Attorney, Agent, or Firm*—Louis Weinstein

[57] ABSTRACT

An instrument preferably employable for a vehicle includes a dial and at least one pointer for indicating the present operative state of the vehicle such as a running speed, an engine speed or the like through a window glass. The dial is illuminated from the rear side by activating a dial illuminating unit, while the pointer is illuminated indirectly via a reflective coating film formed thereon by activating a pointer illuminating unit. The pointer is rotated in a normal direction via a stepping motor when an ignition key is shifted to ON, while it is rotated in a reverse direction when it is shifted to OFF. The instrument is additionally provided with a pointer mask plate made of an opaque plate-shaped material and placed between the window glass and the pointer. The pointer mask plate is located below a zero calibration on the dial and at least the window glass side of the pointer mask plate is blackened without any optical brightness like a frosted glass. When the ignition key is shifted to OFF with a driver's hand to stop running of the vehicle, the pointer is rotated in the reverse direction in excess of the zero calibration on the dial toward the minus angle side of the instrument. Thus, when the window glass is exposed directly to sunlight while the ignition key is shifted to OFF, the pointer can not visually be recognized from the outside because it is fully covered with the pointer mask plate.

7 Claims, 2 Drawing Sheets

INSTRUMENT FOR VEHICLE

BACKGROUND OF THE INVENTION

1. Field of the Invention

The present invention relates generally to an instrument preferably employable for a vehicle for indicating a running speed, an engine speed or the like. More particularly, the present invention relates to improvement of a so-called black-out type instrument preferably employable for a vehicle wherein the whole front surface of the instrument is completely darkened when an ignition key is shifted to OFF by a driver.

2. Description of the Related Art

To facilitate understanding of the present invention, a typical conventional instrument of the aforementioned type will be described below with reference to FIG. 3 and FIG. 4.

The instrument generally designated by reference numeral 90 includes a dial illuminating unit 91 for illuminating a dial 93 when an ignition key (not shown) is shifted to ON with a driver's hand and a pointer illuminating unit 92 for illuminating pointers 94 at the same time as the dial illuminating unit 91. The dial 93 and the pointers 94 are covered with a window glass 95 made of a so-called smoked glass plate having suitable light permeability. With this construction, when the ignition key is shifted to OFF, the whole front surface of the instrument 90 is completely blackened. Thus, the dial 93 and the pointers 94 can visually be recognized so as to allow the present calibrations on the dial 93 to be read by him only when the dial illuminating unit 91 and the pointer illuminating unit 92 are illuminated by shifting the ignition key to ON with a driver's hand.

In FIG. 3, reference numeral 96 designates a stepping motor. In response to an output signal from a calculating circuit 97 for rotating the stepping motor 97 in the normal direction or in the reverse direction, the pointer 94 is rotationally driven in the clockwise direction to reach a predetermined position, i.e., a predetermined calibration 93a on the dial 93 corresponding to the present running state of his car detected by a vehicle speed sensor (not shown).

With the conventional instrument 90 constructed in the above-described manner, the dial illuminating unit 91 make it possible to clearly illuminate the dial 93 because the latter is molded of a light permeable synthetic resin. However, since each pointer 94 is prepared such that it serves as light guiding means while its rear surface is coated with a reflective coating film 94a made of a white-colored paint or the like, the pointer illuminating unit 92 operates at a low optical efficiency compared with the dial illuminating unit 91 because of indirect illumination with the light beam reflected from the coating film 94a, resulting in the pointer 94 being unavoidably visually recognized in the darkened state, i.e., with low brightness.

In the circumstances as mentioned above, when the light permeability of the window glass 95 is predetermined, it is required that it is set to a value sufficiently high so as to enable each pointer 94 to be visually recognized. Thus, when the instrument 90 is exposed directly to sunlight while the ignition key is shifted to OFF, the pointers 94, especially, the white-colored coating films 94a are visually observed with driver's eyes through the window glass 95. This leads to a problem that he feels remarkable visual difference from the visual observation at the time of practical use with the ignition key shifted to ON. In practice, it has been requested from users that the foregoing problem should be obviated.

SUMMARY OF THE INVENTION

The present invention has been made in consideration of the aforementioned background.

An object of the present invention is to provide an instrument preferably employable for a vehicle wherein there does not arise a malfunction that anyone feels remarkable visual difference from the visual observation at the time of practical use with an ignition key shifted to ON with a driver's hand.

According to the present invention, there is provided an instrument preferably employable for a vehicle wherein the instrument comprises a dial having a number of calibrations formed thereon to indicate the present operative state of the vehicle such as a vehicle running speed, an engine speed or the like; at least one pointer having a reflective coating film formed thereon opposite to the dial; a dial illuminating unit for illuminating the dial from the rear side; a pointer illuminating unit for illuminating the pointer indirectly with the light beam reflected from the reflective coating film of the pointer; a stepping motor for rotationally driving the pointer corresponding to the present operative state of the vehicle; a calculating circuit electrically connected to the stepping motor to generate a predetermined number of pulses so as to allow the pointer to be rotated in the normal direction when an ignition key is shifted to ON but rotated in the reverse direction when the ignition key is shifted to OFF to stop running of the vehicle; a window glass having certain suitable light permeability placed on the front side of the instrument; and a pointer mask plate made of an opaque material and placed between the window glass and the pointer, the pointer mask plate being located below a zero calibration on the dial.

It is recommendable that at least the window glass side of the pointer mask plate is blackened without any optical brightness like a frosted glass so as not to allow sunlight to be reflected therefrom when the window glass is exposed directly to the sunlight while the ignition key is shifted to OFF with a driver's hand.

When the ignition key is shifted to OFF to stop running of the vehicle, the calculating circuit is activated to rotate the pointer via the stepping motor in excess of the zero calibration on the dial toward the minus angle side where the pointer is fully covered with the pointer mask plate.

After a predetermined number of pulses are generated by the calculating circuit to rotate the pointer in the above-described manner, the calculating circuit is deactivated by itself, whereby the instrument is blackened.

The arrangement of the pointer mask plate in that way assures that there does arise a malfunction that the driver feels remarkable visual difference from the visual observation at the time of practical use with the ignition key shifted to ON with his hand.

Other objects, features and advantages of the present invention will become apparent from reading of the following description which has been made in conjunction with the accompanying drawings.

BRIEF DESCRIPTION OF THE DRAWINGS

The present invention is illustrated in the following drawings in which.

DESCRIPTION OF THE PREFERRED EMBODIMENT

Figure 1:
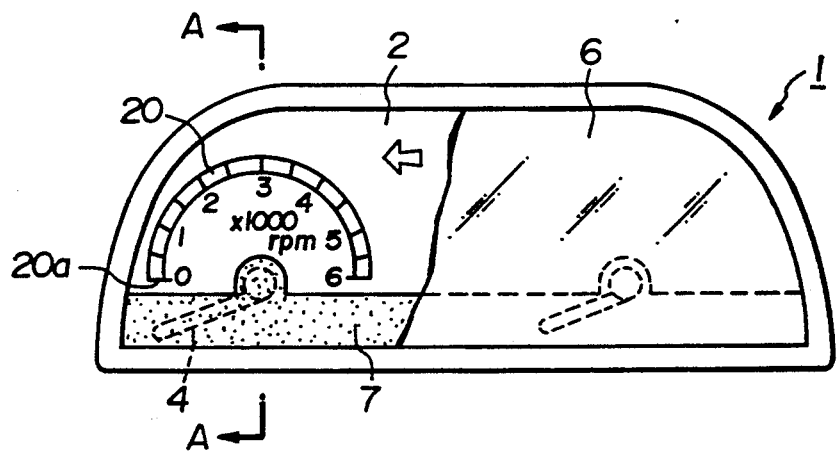
FIG. 1 is a partially exploded front view of an instrument for a vehicle in accordance with an embodiment of the present invention.

The present invention will now be described in detail hereinafter with reference to FIG. 1 and FIG. 2 which illustrate an instrument preferably employable for a vehicle in accordance with a preferred embodiment of the present invention.

The instrument generally designated by reference numeral 1 includes a dial illuminating unit 3 for illuminating a dial 2 from the rear side. In addition, the instrument 1 includes a pointer illuminating unit 5 for illuminating a pointer 4 with light reflected from a reflective coating film 4a. A window glass 6 is made of a so-called smoked plate having certain suitable light permeability. The dial illuminating unit 3 and the pointer illuminating unit 5 are deactivated together when an ignition key 10 is shifted to OFF with a driver's hand. The window glass 6 of the instrument 1 is blackened in the same manner as the conventional instrument when he does not drive his car.

Figure 2:
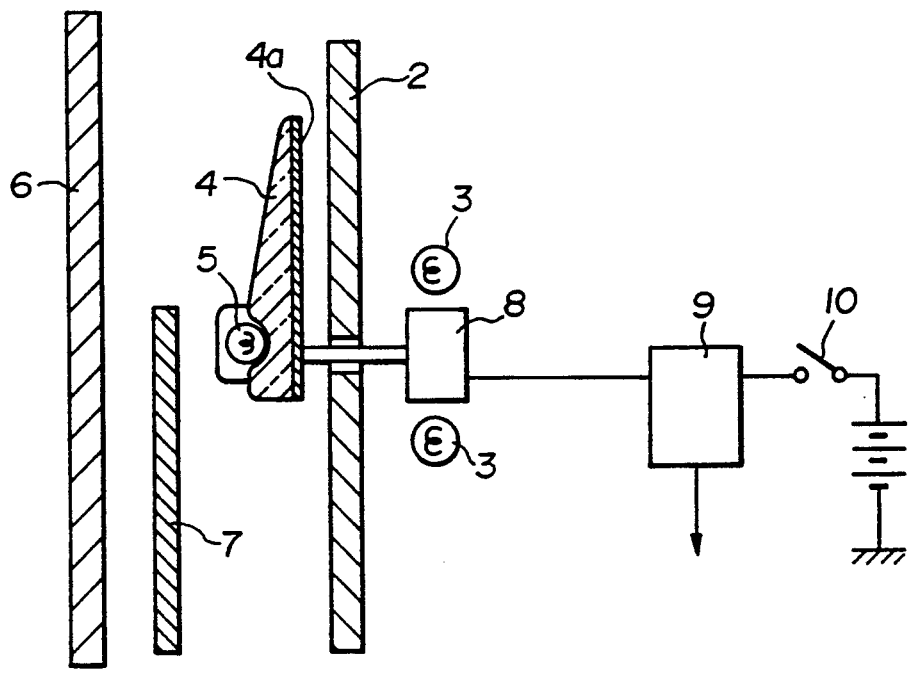
FIG. 2 is a sectional view of the instrument taken along line A — A in FIG. 1.
Figure 3:
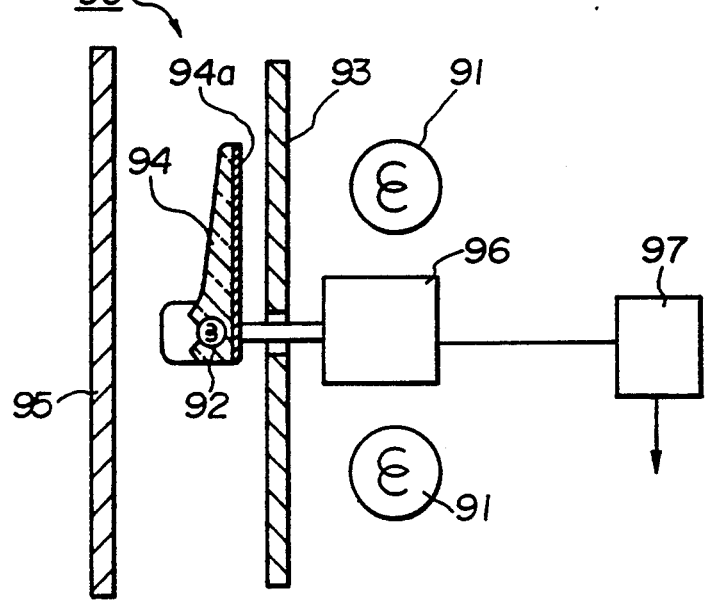
FIG. 3 is a sectional view of a conventional instrument for a vehicle.
Figure 4:
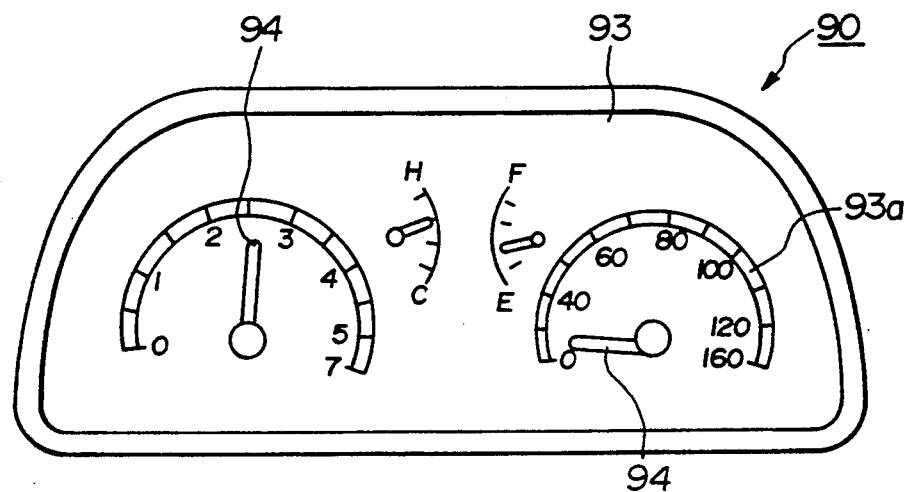
FIG. 4 is a front view of the conventional instrument shown in FIG. 3, particularly illustrating the operative state of the instrument.

A pointer mask plate 7 made of an opaque plate-shaped material is arranged in the region beneath a zero calibration 20a indicating a zero position, i.e., one of calibrations 20 on the dial 2 while it is located between the window glass 6 and the pointer 4 as shown in FIG. 2. The pointer mask plate 7 is coated with a black-colored i.e. opaque material exhibiting no brightness on the window glass 6 side so as not to allow any light beam to be reflected from the pointer mask plate 7.

In addition, the instrument is equipped with a stepping motor 8 for rotationally driving the pointer 4 in the same manner as a conventional instrument. In the shown embodiment, it is assumed that a calculating circuit 9 electrically connected to the stepping motor 8 is activated in response to shifting of the ignition key 10 to ON or OFF in the following manner. Specifically, when the ignition key 10 is shifted to ON, a predetermined number of pulses are outputted therefrom to rotate the pointer 4 in the normal direction, i.e., in the clockwise direction. On the contrary, when it is shifted to OFF, a predetermined number of pulses are outputted therefrom to rotate it in the reverse direction, i.e., in the anticlockwise direction Next, a mode of operation of the instrument 1 constructed in the aforementioned manner will be described below.

While a car (not shown) runs at a cruising speed, the ignition key 10 is naturally shifted to ON. At this time, the dial illuminating unit 3 and the pointer illuminating unit 5 are activated together, whereby a driver can visually recognize through the window glass the present position of the pointer 4 on the dial 2 corresponding to the cruising speed detected by a vehicle speed sensor (not shown).

When he shifts the ignition key 10 to OFF to stop running of his car, the dial illuminating unit 3 and the pointer illuminating unit 5 are deactivated together.

After the calculating circuit 9 generates a predetermined number of pulses for rotating the pointer 4 in the reverse direction, it is deactivated by itself, causing the pointer 4 to be rotated in the anticlockwise direction in excess of a zero calibration 20a toward the minus angle side which is fully covered with the pointer mask plate 7.

When that the glass window 6 of the instrument 1 is exposed directly to sunlight and the running state of his car is stopped with the ignition key 10 shifted to OFF, since the pointer 4 is fully covered with the pointer mask plate 7 made of an opaque plate-shaped material of which the window glass 6 side is blackened without any optical brightness, there is no possibility that sunlight reaches the reflective coating layer 4a of the pointer 4. In addition, since no sunlight is reflected from the pointer mask plate 7 at this time, a so-called black-out effect of the instrument 1 is not lost.

When the ignition key 10 is shifted to ON with a driver's hand to restart operation of the instrument, the dial illuminating circuit bulbs 3 and the pointer illuminating circuit bulb 5 are activated again. At the same time, the calculating circuit 9 generates a predetermined number of pulses to rotate the pointer 4 in the normal direction, whereby the pointer 4 is reset to resume the zero calibration 20a. Thus, the instrument 1 is ready to exhibit its normal function.

As is apparent from the above description, according to the present invention, since the instrument is additionally provided with the pointer mask plate made of an opaque plate-shaped material of which window the glass side is blackened without any optical brightness like a frosted glass while it is located between the window glass and the pointer, the pointer is rotated in the anticlockwise direction in excess of the zero calibration until it is completely hidden by the pointer mask plate, when the ignition key is shifted to OFF to stop running of the car. At this time, the reflected coated film on the pointer is fully covered with the pointer mask plate so as not to allow it to be visually recognized from the outside especially when the window glass is exposed directly to sunlight Thus, there does not arise a malfunction that a driver feels remarkable visual difference from the visual observation at the time of practical use with the ignition key shifted to ON. Consequently, the black-out effect of the instrument can be maintained unchangeably.

While the present invention has been described above merely with respect to a single preferred embodiment thereof, it should of course be understood that the present invention should not be limited only to this embodiment but various change or modification may be made without departure from the scope of the present invention as defined by the appended claims.

What is claimed is:

1. An instrument for a vehicle comprising:
   a dial having front and rear sides and having a number of calibrations formed thereon to indicate the present operative state of said vehicle such as a vehicle running speed, an engine speed or the like, said front side being a view side,
   at least one pointer, arranged a displaced distance from the front side of said dial, having a front and a rear side and having a reflective coating film formed on the rear side opposite to the front side of said dial,
   a dial illuminating unit for illuminating said dial from the rear side thereof, a pointer illuminating unit mounting in said pointer for illuminating said pointer indirectly with a light beam passing through said pointer and reflected from said reflective coating film back into said pointer, and a stepping motor for driving said pointer through a distance corresponding to the present operative state of said vehicle, a calculating circuit electrically connected to said stepping motor to generate a predetermined number of pulses so as to allow said pointer to be moved in a normal direction when an ignition key is shifted to ON and moved in a reverse direction when said ignition key is shifted to OFF to stop running of said vehicle, a window glass having a predetermined suitable light permeability placed on a front side of said instrument so that the pointed is positioned between said window glass and said dial and said window glass is between said pointer and an observer viewing the instrument, and a pointer mask late made of an opaque material and placed between said window glass and said pointer, said pointer mask plate being located below a zero calibration on said dial and having a shape which fully blocks viewing of the illuminating unit regardless of the position of the pointer and which fully blocks viewing of the pointer regardless of an ambient light condition when the pointer is located in a position below said zero calibration, the mask plate having a coating which prevents reflection of sunlight therefrom to maintain a black out effect of the instrument even during a sunlight condition.

2. The instrument according to claim 1, wherein the coating on window glass side of said pointer mask plate is blackened without any optical brightness so as not to allow sunlight to be reflected therefrom when said window glass is exposed directly to said sunlight while said ignition key is shifted to OFF to turn off said illuminating unit.

3. The instrument according to claim 1, wherein when said ignition key is shifted to OFF to stop running of said vehicle, said calculating circuit is activated to move said pointer via said stepping motor to a position displaced from said zero calibration on said dial toward a position where said pointer is substantially completely covered by said pointer mask plate.

4. The instrument according to claim 3, wherein after a predetermined number of pulses are generated by said calculating circuit to rotate said pointer in that way, said calculating circuit is deactivated by itself, whereby said instrument is blackened.

5. The instrument of claim 3 wherein the calibrations on said dial are displaced from said pointer mask plate so that the calibrations are not covered by said pointer mask.

6. The instrument of claim 5 wherein said pointer is displaced from said calibrations when covered by said pointer mask.

7. The instrument of claim 1 wherein said pointer is rotatably mounted and said stepping motor includes means for rotating said pointer.

* * * * *

UNITED STATES PATENT AND TRADEMARK OFFICE
CERTIFICATE OF CORRECTION

PATENT NO.   :   5,295,049
DATED        :   March 15, 1994
INVENTOR(S)  :   Toshiyuki Terada It is certified that error appears in the above-indentified patent and that said Letters Patent is hereby corrected as shown below:

Column 1, line 46, change "make" to --makes--

Column 4, line  8, delete "that"

Column 4, line 31, after "which" insert --the--

Column 4, line 31, after "window" delete "the"

Column 5, line 18, change "pointed" to --pointer--

Column 5, line 22, change "late" to --plate--

Signed and Sealed this

Nineteenth Day of July, 1994

Attest:

BRUCE LEHMAN

*Attesting Officer*      *Commissioner of Patents and Trademarks*